United States Patent
ElAnzeery et al.

(10) Patent No.: US 9,647,153 B2
(45) Date of Patent: May 9, 2017

(54) METHOD FOR FORMING THIN FILM CHALCOGENIDE LAYERS

(71) Applicants: IMEC VZW, Leuven (BE); King Abdulaziz City for Science and Technology, Riyadh (SA); Katholieke Universiteit Leuven, Leuven (BE); Universiteit Hasselt, Hasselt (BE)

(72) Inventors: Hossam ElAnzeery, Cairo (EG); Marie Buffiere, Echire (FR); Marc Meuris, Keerbergen (BE)

(73) Assignees: IMEC VZW, Leuven (BE); King Abdulaziz City for Science and Technology, Riyadh (SA); Katholieke Universiteit Leuven, Leuven (BE); Universiteit Hasselt, Hasselt (BE)

( * ) Notice: Subject to any disclaimer, the term of this patent is extended or adjusted under 35 U.S.C. 154(b) by 0 days.

(21) Appl. No.: 14/846,581

(22) Filed: Sep. 4, 2015

(65) Prior Publication Data

US 2016/0111568 A1    Apr. 21, 2016

(30) Foreign Application Priority Data

Sep. 4, 2014 (EP) .................... 14183583

(51) Int. Cl.
*H01L 31/032* (2006.01)
*H01L 21/02* (2006.01)
*H01L 31/18* (2006.01)

(52) U.S. Cl.
CPC ...... *H01L 31/0326* (2013.01); *H01L 21/0256* (2013.01); *H01L 21/02422* (2013.01);
(Continued)

(58) Field of Classification Search
CPC .................. H01L 21/02568; H01L 31/0326
See application file for complete search history.

(56) References Cited

U.S. PATENT DOCUMENTS

2012/0313200 A1    12/2012 Jackrel et al.
2013/0164885 A1*   6/2013 Liang ............... H01L 21/02472
                                                438/95

FOREIGN PATENT DOCUMENTS

CN    101 330 110 A       12/2008
WO    WO 2013/160369 A1   10/2013

OTHER PUBLICATIONS

Elizabeth A. Lund et al: "Investigating Sputtered Cu2Si1-xSnxS3 [CSTS] for Earth Abundant Thin Film Photovoltaics", 35$^{th}$ IEEE Photovoltaic Specialists Conference, Jun. 2010, pp. 1948-1950, IEEE, Piscataway, NJ.

(Continued)

*Primary Examiner* — Alex A Rolland
(74) *Attorney, Agent, or Firm* — Knobbe, Martens, Olson & Bear LLP (57) ABSTRACT

The disclosed technology generally relates to chalcogenide thin films, and more particularly to ternary and quaternary chalcogenide thin films having a wide band-gap, and further relates to photovoltaic cells containing such thin films, e.g., as an absorber layer. In one aspect, a method of forming a ternary or quaternary thin film chalcogenide layer containing Cu and Si comprises depositing a copper layer on a substrate. The method additionally comprises depositing a silicon layer on the copper layer with a [Cu]/[Si] atomic ratio of at least 0.7, and thereafter annealing in an inert atmosphere. The method further includes performing a first selenization or a first sulfurization, thereby forming a ternary thin film chalcogenide layer on the substrate. In another aspect, a composite structure includes a substrate having a service temperature not exceeding 600° C. and a ternary chalcogenide thin film or a quaternary chalcogenide thin film on the substrate, where the ternary or quaternary (Continued)

chalcogenide thin film comprises a selenide and/or a sulfide containing Cu and Si.

11 Claims, 7 Drawing Sheets

(52) U.S. Cl.
CPC .. *H01L 21/02491* (2013.01); *H01L 21/02557* (2013.01); *H01L 21/02568* (2013.01); *H01L 21/02614* (2013.01); *H01L 31/032* (2013.01); *H01L 31/18* (2013.01); *Y02E 10/50* (2013.01)

(56) References Cited

OTHER PUBLICATIONS

Santanu Bag et al: "Hydrazine-Processed Ge-Substituted CZTSe Solar Cells," Chemistry of Materials, vol. 24, No. 23, Dec. 11, 2012, p. 4588-4593.
European Search Report dated Oct. 12, 2015 in Application No. EP 15183518, 9 pages.

\* cited by examiner

METHOD FOR FORMING THIN FILM CHALCOGENIDE LAYERS

CROSS-REFERENCE TO RELATED APPLICATIONS

This application claims foreign priority to European patent application EP 14183583.5, filed Sep. 4, 2014, the content which is incorporated by reference herein in its entirety.

BACKGROUND

Field

The disclosed technology generally relates to chalcogenide thin films, and more particularly to ternary and quaternary chalcogenide thin films having a wide band-gap, and further relates to photovoltaic cells containing such thin films.

Description of the Related Technology

Some chalcogenide materials, such as $Cu_2SiS_3$ (CSiS), $Cu_2SiSe_3$ (CSiSe), $Cu_2ZnSiSe_4$ (CZSiSe) and $Cu_2ZnSiS_4$ (CZSiS) can be used in photovoltaic technologies, e.g., as an absorber layer in multi-junction thin film photovoltaic cells. Some multi-junction photovoltaic cells are characterized by having at least a top cell and a bottom cell, where the top cell and the bottom cell are made of materials having different optical properties, e.g., different band-gaps. For example, a multi-junction photovoltaic cell may have a top cell having an absorber layer made of a material with a wider band-gap than the absorber layer material of the bottom cell. For example, a bottom cell absorber layer with a relatively narrow band-gap, e.g., about 1 eV, (such as for example crystalline silicon or $CuInSe_2$) can be combined with a top cell having an absorber layer with a relatively wide band-gap, e.g., in the range between about 1.7 eV and 2.2 eV and with a high optical absorption coefficient in the visible light range. As used herein, a wide band-gap refers to a band-gap greater than about 1.5 eV. Thus, the top and bottom cells may be optimized to absorb different portions of the electromagnetic spectrum, such that the resulting multi-junction photovoltaic cell absorbs a greater portion of the electromagnetic spectrum compared to a photovoltaic cell having only one type of absorber layer.

Some chalcogenide materials, such as $Cu_2SiS_3$ (CSiS), $Cu_2SiSe_3$ (CSiSe), $Cu_2ZnSiSe_4$ (CZSiSe) and $Cu_2ZnSiS_4$ (CZSiS), can be adapted to have band-gaps that may be particularly suitable as an absorber layer of such a multi-junction photovoltaic cell, e.g., as an absorber layer for a top cell. Thus, there is a need for fabrication methods for the formation of such thin film absorber layers.

Further, chalcogenide materials such as $Cu_2SiS_3$ (CSiS), $Cu_2SiSe_3$ (CSiSe), $Cu_2ZnSiSe_4$ (CZSiSe) and $Cu_2ZnSiS_4$ (CZSiS) may be economically and technologically desirable alternatives to some existing quaternary wide band-gap absorber layers currently used, such as for example $CuIn_xGa_{(1-x)}S_2$ (CIGS), $CuIn_xGa_{(1-x)}Se_2$ (CIGSe), $Cu_2ZnSnS_4$ (CZTS) and $Cu_2ZnSnSe_4$ (CZTSe), because they don't contain relatively rare and expensive materials such as Ga and In. Furthermore, substitution of Sn by Si may offer an additional benefit of allowing absorber layers having higher band-gap values.

The ternary materials $Cu_2SiS_3$ and $Cu_2SiSe_3$ have attracted interest because of their simple structure as compared to the quaternary state-of-the-art wide band-gap absorber layer materials.

Some quaternary CIGS, CIGSe, CZTS and CZTSe thin film absorber layers for photovoltaic cells are formed using a two-stage process, wherein metallic layers, e.g., all metallic layers, are deposited first, followed by an annealing process, e.g., a single annealing process, that is performed under a selenium and/or sulfur containing atmosphere. However, using such process sequence for the formation of $Cu_2ZnSiSe_4$ or $Cu_2ZnSiS_4$ thin film layers often requires high temperatures, e.g., exceeding 600° C., due to the limited inter-diffusion of Si and Zn. Such high temperatures exceeding 600° C. are often undesirable with certain substrates that have a service temperature not exceeding 600° C. For example, some glass substrates, e.g., some soda-lime glass substrates that are widely used for thin film solar cells, have a glass transition temperature below 600° C. Thus, there is a need for methods of forming thin film absorber layers at lower temperatures, e.g., lower than 600° C.

SUMMARY OF CERTAIN INVENTIVE ASPECTS

The present disclosure aims to provide methods for forming ternary and quaternary thin film chalcogenide ($I_2$-IV-$VI_3$ and $I_2$-II-IV-$VI_4$) layers containing Cu and Si, such as for example $Cu_2SiS_3$, $Cu_2SiSe_3$, $Cu_2ZnSiSe_4$ and $Cu_2ZnSiS_4$ layers.

The present disclosure aims to provide methods for forming ternary and quaternary thin film chalcogenide layers containing Cu and Si, wherein the thin film layers may be formed at temperatures not exceeding 600° C.

In the context of the present disclosure a thin film or a thin layer is a layer with a thickness in the range between a few nanometers and tens of micrometers, e.g. in the range between 50 nanometer and 30 micrometer, e.g. between 100 nanometer and 20 micrometer, e.g. between 100 nanometer and 10 micrometer.

In one aspect, a method for forming ternary and quaternary thin film chalcogenide layers containing copper (Cu) and silicon (Si) comprises: depositing a copper layer on a substrate; depositing a silicon layer on the copper layer wherein the [Cu]/[Si] atomic ratio is at least 0.7; performing a first annealing step in an inert atmosphere at a temperature preferably in the range between 400° C. and 600° C., thereby forming Cu—Si phases; and afterwards performing a first selenization step or a first sulfurization step at a temperature preferably in the range between 400° C. and 600° C., thereby forming a ternary thin film chalcogenide layer.

The method of the present disclosure may further comprise: depositing on the ternary chalcogenide layer a metal layer, such as a Zn layer; performing a second annealing step in an inert atmosphere at a temperature preferably in the range between 350° C. and 450° C.; and afterwards performing a second selenization step and/or a second sulfurization step at a temperature preferably in the range between 400° C. and 600° C., thereby forming a quaternary thin film chalcogenide layer.

In the context of the present disclosure, a selenization step is a process step comprising annealing a layer in a selenium-containing vapor. As a result of the selenization step, selenium (Se) is incorporated into the layer and a selenium-containing layer is formed. In the context of the present disclosure, a sulfurization step is a process step comprising annealing a layer in a sulfur-containing vapor. As a result of the sulfurization step, sulfur (S) is incorporated into the layer and a sulfur-containing layer is formed.

A method of the present disclosure may advantageously be used in a fabrication process for photovoltaic devices such as photovoltaic cells, e.g. multi-junction photovoltaic cells, wherein a ternary or quaternary thin film chalcogenide layer formed in accordance with a method of the present disclosure may be used as a high band-gap absorber layer.

It is an advantage of a method of the present disclosure that the thin film ternary and quaternary chalcogenide layers may be formed at temperatures not exceeding 600° C. It is an advantage that such temperatures are compatible with substrates typically used for thin film photovoltaic cells, such as soda-lime glass substrates.

It is an advantage of a method of the present disclosure that it allows making good wide band-gap (i.e. band-gap larger than 1.5 eV) thin film layers, e.g. for use as absorber layers in thin film photovoltaic cells, using elements that are abundantly available and that are non-toxic. It is an advantage that such thin film layers can be made without the need for using Sn (as opposed to e.g. $Cu_2ZnSnS_4$ or $Cu_2ZnSnSe_4$ absorber layers) and without the need for using scarce materials such as In and Ga (as opposed to e.g., $CuIn_xGa_{(1-x)}S_2$ or $CuIn_xGa_{(1-x)}Se_2$ layers).

In another aspect, a ternary or quaternary thin film chalcogenide layer containing Cu and Si is provided on a substrate whose service temperature does not exceed 600° C. As used herein, a service temperature is a material characteristic which provides information about the thermal stability of a material. For example, for a glass material, a service temperature may be associated with the glass transition temperature. In embodiments where the substrate is a glass, the ternary or quaternary thin film chalcogenide layer containing Cu and Si is provided on a glass substrate with a glass transition temperature lower than 600° C., such as for example a soda-lime glass substrate. In other words, the disclosure is further related to a composite structure comprising a substrate and a ternary or quaternary thin film chalcogenide layer containing Cu and Si, where the thin film chalcogenide layer is provided on the substrate (e.g. being on top of the substrate, e.g. being in direct physical contact with the substrate), where the substrate has a service temperature lower than 600° C., e.g., a substrate with a glass transition temperature lower than 600° C., such as for example a soda-lime glass substrate. The ternary or quaternary thin film chalcogenide layer may, for example, have a thickness in the range between 50 nanometer and 30 micrometer, while the present disclosure is not limited thereto. The ternary or quaternary thin film chalcogenide layer may have a band-gap larger than 1.5 eV.

In another aspect, the disclosure is further related to a photovoltaic cell containing such a ternary or quaternary thin film chalcogenide layer as an absorber layer. The photovoltaic cell may for example be a multi-junction cell.

The disclosure is further related to a photovoltaic cell containing such a composite structure comprising the ternary or quaternary thin film chalcogenide layer as an absorber layer. The photovoltaic cell may for example be a multi-junction cell.

Certain objects and advantages of various inventive aspects have been described herein above. Of course, it is to be understood that not necessarily all such objects or advantages may be achieved in accordance with any particular embodiment of the disclosure. Thus, for example, those skilled in the art will recognize that the disclosure may be embodied or carried out in a manner that achieves or optimizes one advantage or group of advantages as taught herein without necessarily achieving other objects or advantages as may be taught or suggested herein. Further, it is understood that this summary is merely an example and is not intended to limit the scope of the disclosure. The disclosure, both as to organization and method of operation, together with features and advantages thereof, may best be understood by reference to the following detailed description when read in conjunction with the accompanying drawings.

BRIEF DESCRIPTION OF THE DRAWINGS

FIG. 1 and FIG. 2(a) to FIG. 2(d) schematically illustrate process steps of a method for forming a ternary chalcogenide layer in accordance with embodiments of the present disclosure.

FIG. 9 and FIG. 10(a) to FIG. 10(d) schematically illustrate process steps of a method for forming a quaternary chalcogenide layer in accordance with embodiments of the present disclosure.

In the different drawings, the same reference signs refer to the same or analogous elements.

DETAILED DESCRIPTION OF CERTAIN ILLUSTRATIVE EMBODIMENTS

In the following detailed description, numerous specific details are set forth in order to provide a thorough understanding of the disclosure and how it may be practiced in particular embodiments. However, it will be understood that the present disclosure may be practiced without these specific details. In other instances, well-known methods, procedures and techniques have not been described in detail, so as not to obscure the present disclosure.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

The present disclosure provides methods for forming ternary and quaternary thin film chalcogenide layers containing Cu and Si. A method of the present disclosure comprises: depositing on a substrate a copper layer; depositing a silicon layer on the copper layer wherein the [Cu]/[Si] atomic ratio is at least 0.7; performing a first annealing step in an inert atmosphere at a temperature preferably in the range between 400° C. and 600° C. to form Cu—Si phases; and afterwards performing a first selenization step or a first sulfurization step at a temperature preferably in the range between 400° C. and 600° C., thereby forming a ternary thin film chalcogenide layer.

The method of the present disclosure may further comprise: depositing on the ternary chalcogenide layer a metal layer such as a Zn layer; performing a second annealing step in an inert atmosphere at a temperature preferably in the range between 350° C. and 450° C.; and afterwards performing a second selenization step and/or a second sulfurization step at a temperature preferably in the range between 400° C. and 600° C., thereby forming a quaternary thin film chalcogenide layer.

Figure 1:
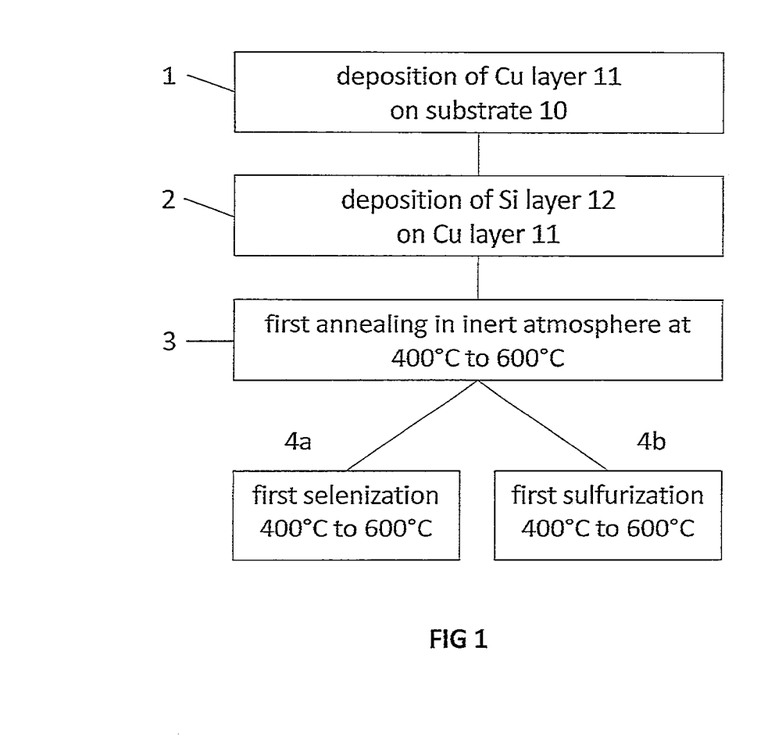

Process steps of a method according to the present disclosure are schematically illustrated in FIG. 1 and in FIGS. 2(a) to 2(d).

Figures 2, 2A, 2D:
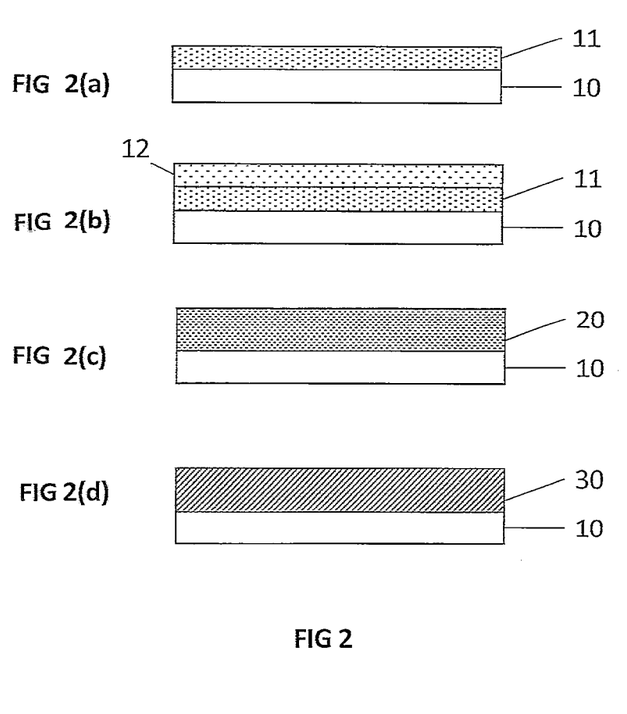

Referring to FIG. 1 step 1 and FIG. 2(a), a thin copper layer 11 is deposited on a substrate 10, according to embodiments. Next (FIG. 1 step 2; FIG. 2(b)), a thin silicon layer 12 is deposited on the thin copper layer 11, according to embodiments. Examples of suitable and commonly used substrates for photovoltaic cells are soda-lime glass (SLG) and molybdenum-coated soda-lime glass (Mo/SLG), but other suitable substrates may be used. Known thin film deposition techniques may be used for depositing the thin copper layer 11 and the thin silicon layer 12, such as for example sputtering, electron beam evaporation, thermal evaporation or other processes and combinations thereof. The thickness of the Cu layer and the thickness of the Si layer may be calculated based on the desired thickness and the desired composition of the final absorber material layer. The ratio between the thickness of the Cu layer and the thickness of the Si layer may be calculated based on the required ratio between the Cu and Si atoms in the chemical formula. For example, for $Cu_2SiSe_3$, approximately two times more Cu atoms are needed as compared to Si atoms. Based on the atomic density of copper and the atomic density of silicon, the ratio between Cu layer thickness and the Si layer thickness, needed to achieve the approximate factor of two, can be calculated.

In a next step (FIG. 1 step 3; FIG. 2(c)) the substrate 10 with the stack of the copper layer 11 and the silicon layer 12 is annealed (first annealing), according to embodiments. According to some embodiments, the first annealing process is be performed in an inert atmosphere, e.g. in a nitrogen atmosphere or in an argon atmosphere, at a temperature preferably in the range between 400° C. and 600° C., thereby forming Cu—Si phases such as $Cu_3Si$, $Cu_4Si$ and $Cu_5Si$. Under some circumstances, at the higher annealing temperatures within this range, e.g. at temperatures in the range between 500° C. and 600° C., multiple phases are formed, which may be undesirable form some applications. Therefore in some embodiments, the annealing temperature at this process step is selected to be between 400° C. and 500° C., preferably close to 400°, for example in the range between 400° C. and 450° C., e.g. between 400° C. and 420° C., however, the present disclosure is not being limited thereto. This first annealing step may for example take about 5 to 30 minutes, preferably 10 to 15 minutes. As a result of this first annealing step a Cu—Si layer 20 (FIG. 2(c)) containing copper silicide phases (e.g., $Cu_3Si$, $Cu_4Si$ and $Cu_5Si$) is formed. The formation of these Cu—Si phases takes place over a range of chemical compositions, for a [Cu]/[Si] ratio being at least 0.7.

Figure 3:
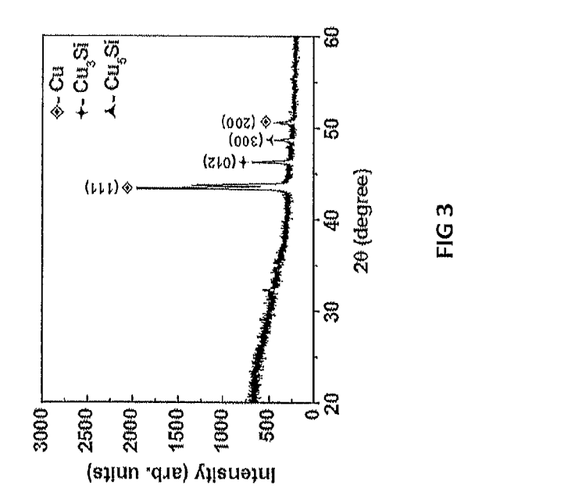
FIG. 3 is an example experimental XRD (X-ray diffraction) spectrum illustrating the formation of copper silicide phases as an intermediate step in a process according to a method of the present disclosure.

FIG. 3 shows an experimental XRD (X-ray diffraction) spectrum of a sample prepared according to a process described above with respect to FIG. 1 and FIGS. 2(a)-2(c). The particular example experimental XRD spectrum corresponds to sample prepared by first depositing a 500 nm thick Cu layer 11 on a soda-lime glass substrate 10, followed by depositing a 165 nm thick Si layer 12 on the Cu layer 11. Next an annealing step was done in a nitrogen environment at 400° C. for 15 minutes. The XRD spectra peaks measured as shown in FIG. 3 correspond to the known peaks of Cu—Si phases, thus confirming the formation of a copper silicide layer 20.

Referring back to FIGS. 1 and 2(d), after annealing (first annealing) in an inert atmosphere according the step 3 of FIG. 1 and FIG. 2(c), a first selenization process 4a, or alternatively a first sulfurization process 4b is performed, according to embodiments.

The first selenization process 4a may be performed by exposing the sample to a Se containing atmosphere, for example for 10 to 15 minutes at a temperature in the range between 400° C. and 600° C., for example in the range between 450° C. and 580° C. During the selenization process, Se atoms are incorporated into the Cu—Si layer 20, resulting in the formation of a ternary chalcogenide layer 30 (FIG. 2(d)) containing a ternary phase, e.g., $Cu_2SiSe_3$. The Se containing atmosphere may for example be an $H_2Se/N_2$ atmosphere or a Se vapor atmosphere, the present disclosure not being limited thereto.

Figure 4:
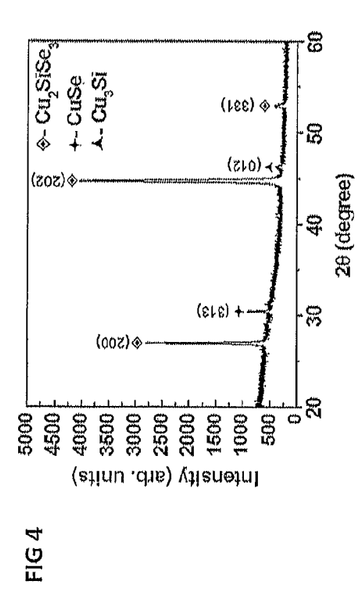
FIG. 4 is an example experimental XRD spectrum illustrating the formation of a $Cu_2SiSe_3$ phase in a process according to a method of the present disclosure.

FIG. 4 shows an example experimental XRD spectrum of a sample prepared according to a process described above with respect to FIG. 1 (steps 1-4a) and FIGS. 2(a)-2(d), wherein a selenization process was performed in a $H_2Se/N_2$ atmosphere for 15 minutes at 490° C., illustrating the formation of the $Cu_2SiSe_3$ ternary phase.

The first sulfurization process 4b may be performed by exposing the sample to a sulfur containing atmosphere, for example for 10 to 15 minutes at a temperature in the range between 400° C. and 600° C., for example in the range between 450° C. and 580° C. During the sulfurization process S is incorporated into the Cu—Si layer 20, resulting in the formation of a ternary chalcogenide layer 30 (FIG.

2(d)) containing the ternary phase $Cu_2SiS_3$. The sulfur-containing atmosphere may for example be an $H_2S/N_2$ atmosphere or a sulfur vapor atmosphere, the present disclosure not being limited thereto.

Figure 5:
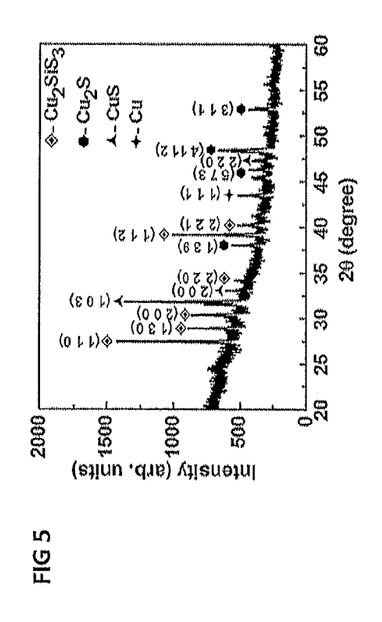
FIG. 5 is an example experimental XRD spectrum, illustrating the formation of a $Cu_2SiS_3$ phase in a process according to a method of the present disclosure.

FIG. 5 shows an example experimental XRD spectrum of a sample prepared according to a process described above with respect to FIG. 1 (steps 1-4b) and FIGS. 2(a)-2(d), wherein a sulfurization process was done in a $H_2S/N_2$ atmosphere for 15 minutes at 540° C., illustrating the formation of the $Cu_2SiS_3$ ternary phase, as well as Cu—S phases. When this layer is used as an absorber layer in a photovoltaic cell, the binary Cu—S phases present in the film may for example be selectively removed using a KCN (potassium cyanide) etching step.

Figure 6A:
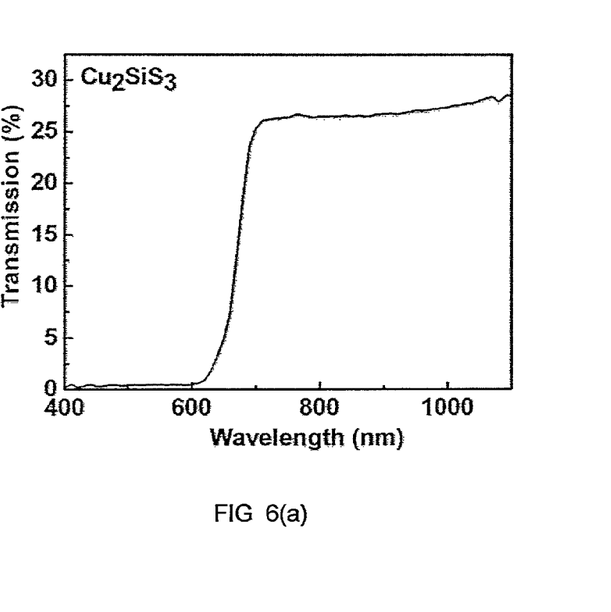
FIG. 6(a) is an example experimental transmission spectrum for a thin film $Cu_2SiS_3$ layer formed according to a method of the present disclosure, in the wavelength range from 400 nm to 1200 nm.
Figure 6B:
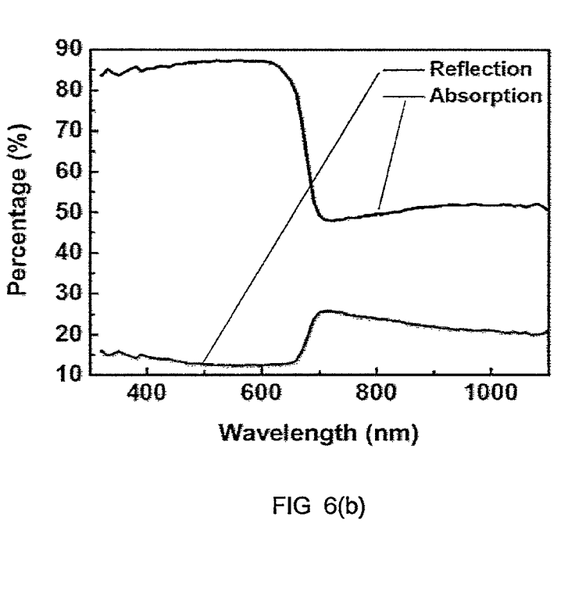
FIG. 6(b) shows an example experimental reflection spectrum and an example experimental absorption spectrum for a thin film $Cu_2SiS_3$ layer formed according to a method of the present disclosure, in the wavelength range from 200 nm to 1200 nm.

FIG. 6(a) shows an experimental optical transmission measurements on a thin $Cu_2SiS_3$ film (thickness about 700 nm to 800 nm) prepared in accordance with the present disclosure, in the wavelength range from 400 nm to 1200 nm. The optical transmission measurements were done using an integrating sphere. FIG. 6(b) shows the absorption and reflection of this film in the wavelength range between 200 nm and 1200 nm. Reflection measurements were done using an integrating sphere, and the absorption values were calculated based on the reflection and transmission measurements (absorption=1−reflection−transmission). The optical characteristics show a clear band-gap, with a high optical absorption at wavelengths below 650 nm and a low optical absorption at wavelengths higher than 750 nm.

Figure 7:
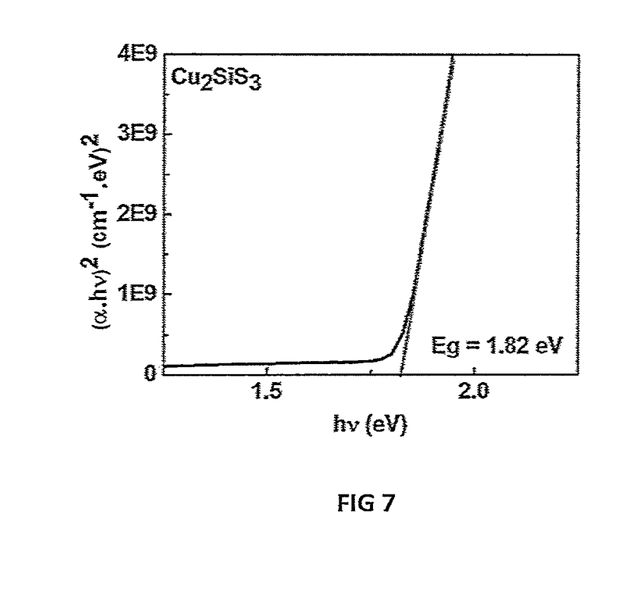
FIG. 7 is a graphical illustration of determining the band-gap based on a plot of the energy dependence of $(\alpha E)^2$ for a $Cu_2SiS_3$ layer formed according to a method of the present disclosure.
Figure 8:
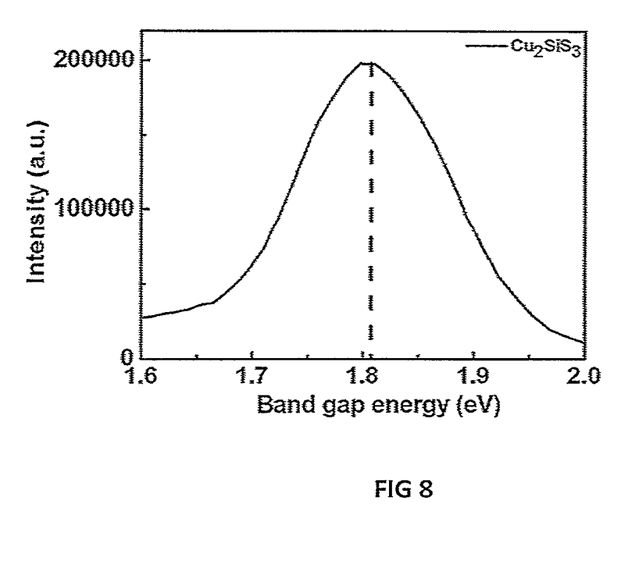
FIG. 8 shows an example experimental photoluminescence spectrum of a $Cu_2SiS_3$ layer formed according to a method of the present disclosure.
Figure 9:
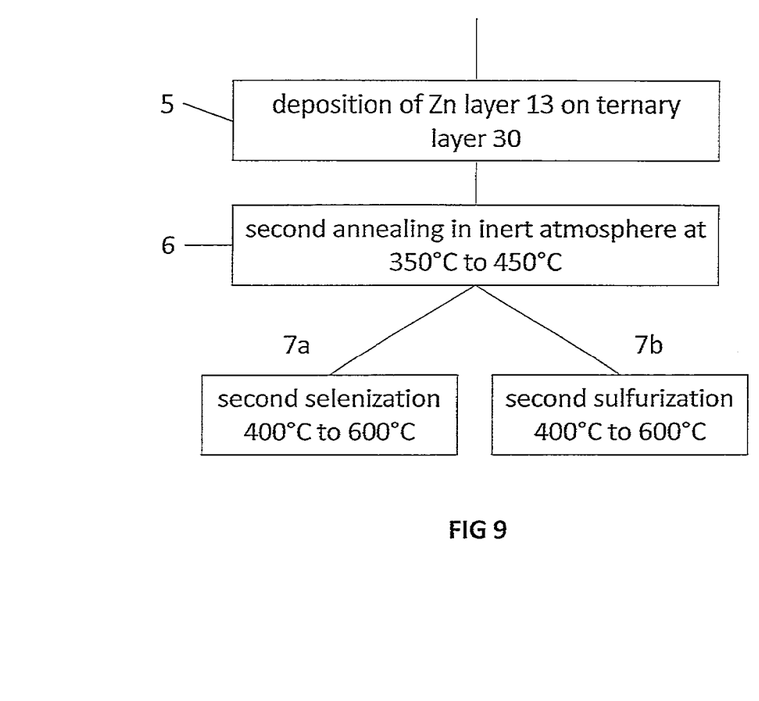

Referring to FIG. 7, based on an extrapolation of the band-gap from the linear portion of the energy dependence of $(\alpha E)^2$ (=$(\alpha h \nu)^2$), wherein $\alpha$ is the optical absorption coefficient, an optical band-gap of 1.82 eV is obtained for the $Cu_2SiS_3$ layer formed in accordance with a method of the present disclosure. An experimental photoluminescence (PL) spectrum of the $Cu_2SiS_3$ layer, shown in FIG. 8, also shows a direct band-gap of 1.82 eV. The vertical dashed line corresponds to the location of the energy gap of the absorber material.

The ternary films 30 ($Cu_2SiS_3$ and $Cu_2SiSe_3$) formed according to a method of the present disclosure may be used as an absorber layer in a photovoltaic cell, e.g. as a wide band-gap absorber layer in a multi-junction or tandem photovoltaic cell. These ternary thin films may also be used for other applications, such as for example for opto-electronics and semiconductor applications.

The ternary thin film layers 30 ($Cu_2SiS_3$ and $Cu_2SiSe_3$) described above with respect to FIG. 2(d) may be further processed to form quaternary thin film layers, according to embodiments. This is schematically illustrated in FIG. 9 and FIGS. 10(a) to 10(d).

Figures 10, 10A:
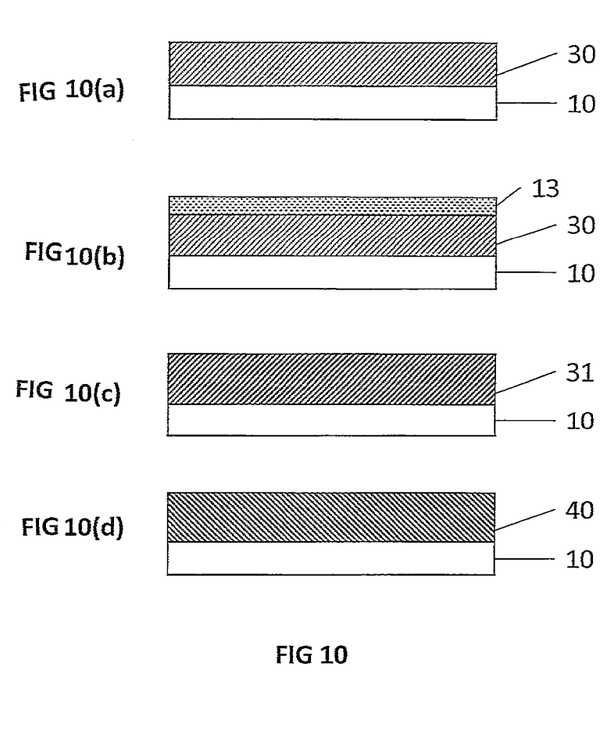

FIG. 10(a) shows a structure comprising a substrate 10 and a ternary chalcogenide layer 30, corresponding to the structure shown in FIG. 2(d)). Starting from this structure, for example (FIG. 9 step 5, FIG. 10(b)), a thin film layer of zinc (Zn) 13, with a thickness in accordance with the required film composition, for example in the range between 100 nm and 160 nm, may be deposited onto the selenized or sulfurized ternary material layer ($Cu_2SiS_3$ or $Cu_2SiSe_3$) 30, using methods known in the art, such as for example by sputtering or evaporation.

Next, at step 6 (FIG. 9) a second annealing step is done in an inert atmosphere at a temperature preferably in the range between 350° C. and 450° C., for example in an $N_2$ or Ar gas atmosphere at 390° C., e.g. for 10 to 15 minutes. This second annealing step causes diffusion of the Zn atoms into the ternary layer 30, resulting in a Zn containing layer 31 (FIG. 10(c)). This annealing step is done to enable diffusion of the Zn atoms into the previously formed ternary layer before adding further Se or S (i.e. before a second selenization or sulfurization step).

Afterwards a second selenization (step 7a) or a second sulfurization (step 7b) is done, by exposure of the sample with layer 31 to a $H_2Se$ containing gas, selenium (Se) vapor, a $H_2S$ containing gas or sulfur (S) vapor, at a temperature in the range between 400° C. and 600° C., for example at 490° C. for 10 to 15 minutes. This leads to the formation of a quaternary chalcogenide layer 40 containing the quaternary phase $Cu_2ZnSiSe_4$ or $Cu_2ZnSiS_4$ (FIG. 10(d)).

Figure 11:
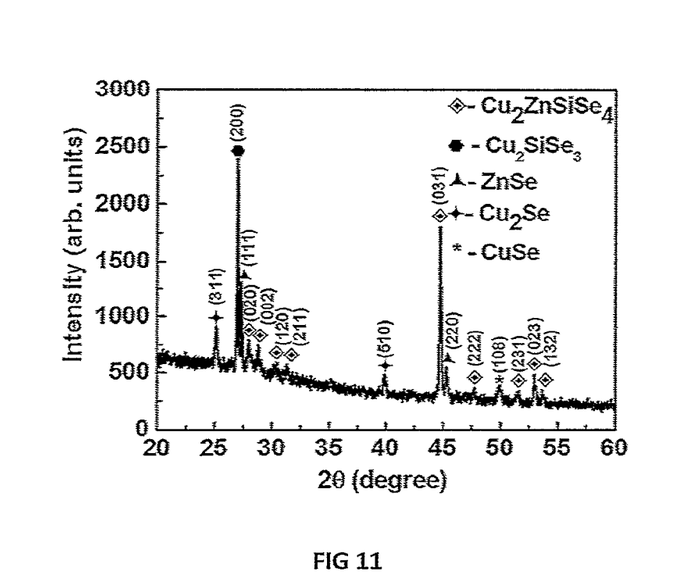
FIG. 11 shows an example experimental XRD spectrum, illustrating the formation of a $Cu_2ZnSiSe_4$ phase in a process according to a method of the present disclosure.

The experimental XRD spectrum shown in FIG. 11 confirms the presence of the quaternary phase alloy, as is evident from the presence of the (simulated in advance) XRD spectra peaks of $Cu_2ZnSiSe_4$.

Figure 12:
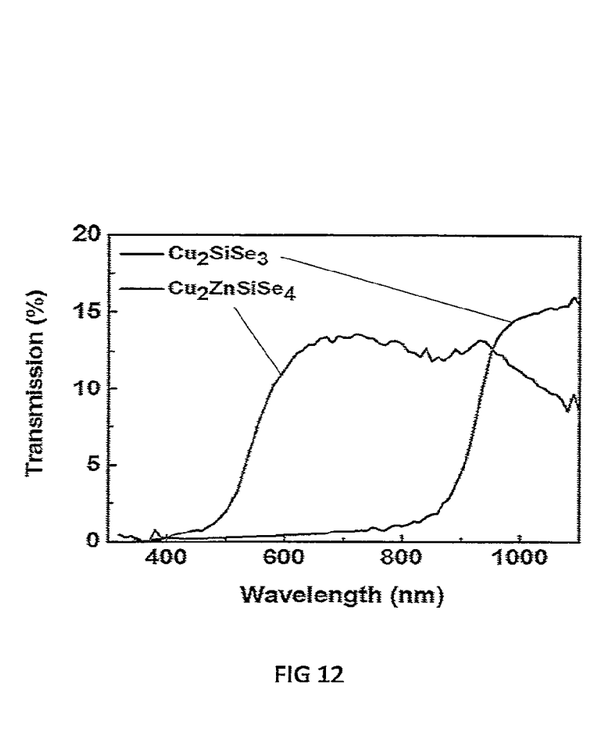
FIG. 12 shows an example experimental transmission spectrum for a $Cu_2SiSe_3$ layer and for a $Cu_2ZnSiSe_4$ layer formed according to a method of the present disclosure.

FIG. 12 shows the transmission of a ternary $Cu_2SiSe_3$ thin film layer formed in accordance with a method of the present disclosure (layer 30 in FIG. 2(d) and in FIG. 10(a)) and of a quaternary $Cu_2ZnSiSe_3$ layer formed in accordance with a method of the present disclosure (layer 40 in FIG. 10(d)). The ternary $Cu_2SiSe_3$ thin film layer was formed by depositing a 500 nm thick Cu layer on a soda-lime glass substrate, depositing a 165 nm thick Si layer on the Cu layer, next performing an annealing (first annealing) in a nitrogen atmosphere at 400° C. for 15 minutes and finally performing a selenization step (first selenization) in a $H_2Se/N_2$ environment at 490° C. for 15 minutes. The quaternary thin film $Cu_2ZnSiSe_3$ layer was formed starting from this ternary $Cu_2SiSe_3$ thin film layer by depositing a 110 nm thick Zn layer on the ternary layer, performing an annealing (second annealing) in a nitrogen atmosphere at 390° C. during 10 minutes and finally performing a selenization step (second selenization) in a $H_2Se/N_2$ atmosphere at 490° C. for 15 minutes. From the transmission data shown in FIG. 12 it can be seen that the quaternary thin film has a substantially larger band-gap than the ternary thin film.

Figure 13:
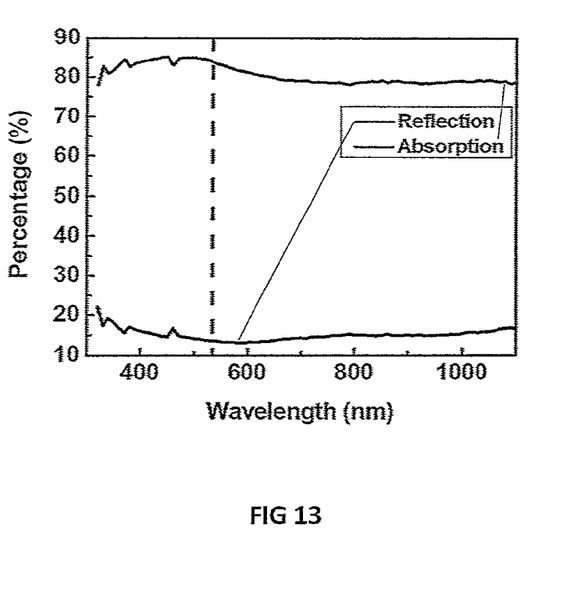
FIG. 13 shows an example experimental reflection spectrum and an example absorption spectrum for a thin film $Cu_2ZnSiSe_4$ layer formed according to a method of the present disclosure, in the wavelength range from 200 nm to 1200 nm.

FIG. 13 shows the measured reflection spectrum and the absorption for the thin film $Cu_2ZnSiSe_4$ layer, in the wavelength range from 200 nm to 1200 nm. The vertical dashed line corresponds to the location of the energy gap of the absorber material. The high absorption values at higher wavelengths may be attributed to the presence of secondary phases. When this layer is used in a photovoltaic cell, for example in a tandem cell, the secondary phases may be removed selectively, for example by etching in KCN.

Figure 14:
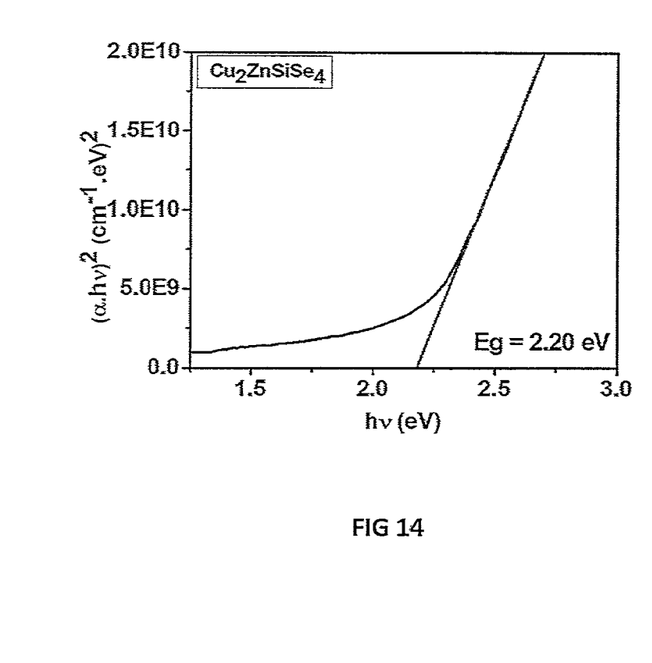
FIG. 14 is a graphical illustration of determining the band-gap based on a plot of the energy dependence of $(\alpha E)^2$ for a $Cu_2ZnSiSe_4$ layer formed according to a method of the present disclosure.

FIG. 14 illustrates the determination of the band-gap based on the energy dependence of $(\alpha E)^2$ for the $Cu_2ZnSiS_4$ layer formed as described above, showing a band-gap of 2.2 eV.

The foregoing description details certain embodiments of the disclosure. It will be appreciated, however, that no matter how detailed the foregoing appears in text, the disclosure may be practiced in many ways. It should be noted that the use of particular terminology when describing certain features or aspects of the disclosure should not be taken to imply that the terminology is being re-defined herein to be restricted to including any specific characteristics of the features or aspects of the disclosure with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the invention.

What is claimed is:

1. A method of forming a chalcogenide thin film containing copper and silicon, the method comprising:
   depositing a copper layer on a substrate;
   depositing a silicon layer on the copper layer, wherein an atomic ratio of the deposited copper to the deposited silicon is at least 0.7;
   after depositing the copper layer and the silicon layer, annealing the deposited layers in an inert atmosphere, thereby forming a Cu-Si alloy layer; and
   after annealing, performing a first selenization of the Cu-Si alloy layer, thereby forming the chalcogenide thin film comprising a selenide.

2. The method according to claim 1, wherein annealing is performed at a temperature between 400° C. and 600° C.

3. The method according to claim 2, wherein annealing is performed at a temperature between 400° C. and 450° C.

4. The method according to claim 1, wherein annealing is performed at a temperature, for a duration and under an ambience such that at least one of $Cu_3Si$, $Cu_4Si$ and $Cu_5Si$ is formed, and wherein annealing is performed before performing the first selenization.

5. The method according to claim 1, wherein the first selenization is performed at a temperature between 400° C. and 600° C.

6. The method according to claim 1, wherein the first selenization is performed at a temperature, for a duration and under an ambience such that at least one of $Cu_2SiSe_3$ and CuSe is formed.

7. The method according to claim 1, further comprising:
   depositing a metal on the chalcogenide thin film;
   after depositing the metal, further annealing in an inert atmosphere, thereby diffusing the metal into the chalcogenide thin film; and
   after further annealing, performing a second selenization of the metal-containing chalcogenide thin film, thereby forming a quaternary chalcogenide thin film comprising a selenide.

8. The method according to claim 7, wherein depositing the metal comprises depositing a Zn layer.

9. The method according to claim 7, wherein further annealing is performed at a temperature between 350° C. and 450° C.

10. The method according to claim 7, wherein the second selenization is performed at a temperature between 400° C. and 600° C.

11. The method according to claim 7, wherein the second selenization is performed at a temperature, for a duration and under an ambience such that $Cu_2ZnSiSe_4$ is formed.

* * * * *